US 9,652,581 B2

(12) United States Patent
Pikus et al.

(10) Patent No.: US 9,652,581 B2
(45) Date of Patent: May 16, 2017

(54) DIRECTED SELF-ASSEMBLY-AWARE LAYOUT DECOMPOSITION FOR MULTIPLE PATTERNING

(71) Applicant: Mentor Graphics Corporation, Wilsonville, OR (US)

(72) Inventors: Fedor Pikus, Beaverton, OR (US); Juan Andres Torres Robles, Wilsonville, OR (US); Joydeep Mitra, Austin, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/745,231

(22) Filed: Jun. 19, 2015

(65) Prior Publication Data
US 2016/0292345 A1   Oct. 6, 2016

Related U.S. Application Data

(60) Provisional application No. 62/140,372, filed on Mar. 30, 2015.

(51) Int. Cl.
*G06F 17/50* (2006.01)
(52) U.S. Cl.
CPC ................ *G06F 17/5081* (2013.01)
(58) Field of Classification Search
CPC ............. G06F 17/5081; G06F 2217/06; G06F 2217/12; G03F 7/70466; G03F 1/144; G03F 1/70; G03F 7/0035; G03F 7/70433
See application file for complete search history.

(56) References Cited

U.S. PATENT DOCUMENTS

| | | | | |
|---|---|---|---|---|
| 8,484,608 | B2 * | 7/2013 | Delp ..................... | G06F 17/505 716/116 |
| 9,158,885 | B1 * | 10/2015 | Gray .................. | G06F 17/5081 716/52 |
| 2015/0089457 | A1 * | 3/2015 | Agarwal ............ | G03F 7/70466 716/52 |
| 2015/0234974 | A1 * | 8/2015 | Dechene ............ | G06F 17/5081 716/52 |
| 2015/0286771 | A1 * | 10/2015 | Choi ..................... | G03F 7/0035 716/51 |

* cited by examiner

*Primary Examiner* — Vuthe Siek
(74) *Attorney, Agent, or Firm* — Banner & Witcoff, Ltd.

(57) ABSTRACT

Aspects of the disclosed technology relate to techniques of combining directed self-assembly lithography and multiple patterning lithography. A coloring/grouping graph is first generated from layout data of a layout design. In the coloring/grouping graph, each coloring edge connects two nodes representing layout features that must be assigned to different masks, and each grouping/coloring edge connects two nodes representing layout features that should either be grouped together for DSA (directed-self-assembly) lithography or be assigned to different masks for multiple patterning lithography. The node groups formed by nodes connected with the coloring edges are colored. Colors of the nodes in one or more of node groups connected by the grouping/coloring edges are adjusted to convert one or more of the grouping/coloring edges into the coloring edges. After conversion, layout features represented by the nodes directly connected with the grouping/coloring edges are grouped together for generating guiding patterns.

20 Claims, 7 Drawing Sheets

DIRECTED SELF-ASSEMBLY-AWARE LAYOUT DECOMPOSITION FOR MULTIPLE PATTERNING

RELATED APPLICATIONS

This application claims the benefit of U.S. Provisional Patent Application No. 62/140,372, filed on Mar. 30, 2015, and naming Juan Andres Torres Robles et al. as inventors, which application is incorporated entirely herein by reference.

FIELD OF THE DISCLOSED TECHNOLOGY

The present disclosed technology relates to photolithographic processing technologies. Various implementations of the disclosed technology may be particularly useful for combining directed self-assembly with multiple patterning lithography.

BACKGROUND OF THE DISCLOSED TECHNOLOGY

Conventional lithographic imaging processes employ liquid immersion to increase the effective numerical aperture (NA) and make use of extensive resolution enhancement techniques (RET). This appears adequate to meet the lithographic needs of integrated circuits through the 32 nm generation. Starting from the 22 nm node, the numerical aperture NA has only marginally increased and the $k_1$ value is approaching the theoretical limit of 0.25. Further lithography scaling has been relied mainly on double or even multiple patterning techniques. While multiple patterning techniques provide the resolution required for further scaling, the overall cost to implement multiple patterning techniques has reached a level that other techniques may need to be explored.

Directed self-assembly (DSA) has recently emerged as such a technique for lithographic patterning to reach 22 nm and below. In self-assembly, the formation of features of fine geometric dimensions occurs not through external patterning, but through the spontaneous phase behavior found among polymers on the molecular level. Of particular interest are diblock copolymers formed by chemically connecting normally incompatible species, such as poly(styrene) (PS) and poly(methyl-methacrylate) (PMMA). By creating linked chains of these materials and controlling the relative molecular weight, various structures can spontaneously form. The appeal of these structures, easily formed around 20 nm in size, is that the boundaries between the two disparate polymers can be quite uniform, with the uniformity dictated not by the noise properties of a patterning process, but by the relative molecular weight of the polymers. This is a quantity that can be precisely controlled.

One problem with these polymers is that, although local order and roughness can be quite good, small variations in the polymer chain can lead to kinks that reset the self-assembly process. Long range patterns therefore appear somewhat chaotic. The problem of long range order can be addressed by using a conventional patterning process to guide and direct the spontaneous formation of the block co-polymer structures. This "directed self-assembly" can take the form of having the self-assembly occur in grooves (grapho-epitaxy) or other geometrically confined regions or by chemically patterning a surface to create local affinities to the various portions of the block co-polymers (chemo-epitaxy).

In a grapho-epitaxy process, the main mechanism by which the block-copolymer self organizes in useful domains, is dominated by the concept of confinement. Neutral walls or pillars prevent certain chain configurations which then lead to the polymer to adjust its periodic structures along a pre-determined axis. The benefit of this technique is that the guiding pattern can be very local and there is limited interdependency between different organization domains.

A chemo-epitaxy process defines the preferred direction by a chemical brush which changes the surface energy of the substrate, by doing so and due to the different chemical affinity of the different diblock species to the substrate, the material organizes in a preferential direction minimizing the energy required to achieve a specific configuration. The benefit of this technique is the ability to pattern dense gratings or arrays as the guiding patterns are underneath the block-copolymer.

A lot of progress of DSA in getting impressive resolution has been repeatedly demonstrated using the PS-PMMA system. Some record low pitches of sub-15 nm have been observed in laboratory recently. DSA also has an advantage of not requiring new capital equipment investment and can be used complimentary with other lithographic techniques such as multiple patterning. Using a grapho-epitaxy process for contact and via layers seems like a promising technique as it has the potential to reduce total mask count and remove at least one patterning step from the process of record while maintaining the yield. For example, a triple patterning process coupled with DSA could replace a traditional quadruple patterning process, significantly reducing manufacturing costs. This is achieved by grouping the neighboring sub-resolution features and putting them on the same mask.

Two sequential approaches may be used to implement the hybrid DSA-multiple patterning lithography. The first is a decomposition-then-grouping flow: layout decomposition (mask assignment) for multiple patterning is performed first, and then DSA grouping is performed on each resultant mask separately. The second is a grouping-then-decomposition flow: DSA grouping is performed on the complete layer of a design, and then mask assignment is done on the resulting groups and features unable to be grouped.

Both of the flows can fail on some simple via feature designs, as shown in a paper by Yasmine Badr, et al. "Incorporating DSA in multipatterning semiconductor manufacturing technologies", Proc. SPIE 9427, Design-Process-Technology Co-optimization for Manufacturability IX, 94270P (Mar. 18, 2015), which is incorporated herein by reference. The reason for the failure of the decomposition-then-grouping flow is the multiple-patterning decomposer gives equal priority to all pairs of polygons having spacing less than the minimum lithography distance (the distance for considering multiple patterning and/or DSA). This ignores the fact that pairs of contacts (vias) aligned on the same vertical or horizontal axis could be DSA-grouped and accordingly assigned to the same mask. The grouping-then-decomposition flow fails because a lot of contacts are within ranges for considering the DSA-grouping and many of the resulted complex groups are DSA-disqualified due to the lithography and self-assembly constraints. These DSA-disqualified groups of contacts have to be handled mostly by the multiple-patterning decomposition, which in turn led to a large number of violations.

It is therefore desirable to search for techniques that can combine the DSA-grouping technique and the multiple-patterning technique in a parallel fashion.

BRIEF SUMMARY OF THE DISCLOSED TECHNOLOGY

Various aspects of the present disclosed technology relate to techniques of combining directed self-assembly lithography and multiple patterning lithography. In one aspect, there is a method comprising: generating a coloring/grouping graph from layout data of a layout design, the layout design corresponding to at least a portion of an integrated circuit, and the coloring/grouping graph comprising nodes, coloring edges, and grouping/coloring edges, wherein the nodes represent layout features in the layout design, each of the coloring edges connects two of the nodes representing layout features that must be assigned to different masks, and each of the grouping/coloring edges connects two of the nodes representing layout features that should either be grouped together for DSA (directed-self-assembly) lithography or be assigned to different masks; coloring the nodes by assigning different colors to the nodes connected directly with the coloring edges, each of the colors representing one of masks employed for multiple patterning lithography, the nodes connected with the coloring edges forming node groups, any two of the node groups being either connected with the grouping/coloring edges or not connected; and converting one or more of the grouping/coloring edges into the coloring edges, wherein the converting comprises adjusting colors of the nodes in one or more of the node groups connected by the grouping/coloring edges.

According to some embodiments of the disclosed technology, the method may further comprise grouping layout features corresponding to the nodes connected by the existing grouping/coloring edges into layout feature groups; and generating guiding patterns for the layout feature groups.

According to some other embodiments of the disclosed technology, the method may further comprise reporting coloring violations. The method may still further comprise modifying the layout design to remove the coloring violations.

The layout features represented by nodes connected with the grouping/coloring edges may comprise vias. The adjusting may be based on DSA constraints, the DSA constraints comprising a maximum number of layout features that can be grouped together. The coloring edges and the grouping/coloring edges may be determined based on distance between the layout features.

In another aspect, there are one or more computer-readable media storing computer-executable instructions for causing one or more processors to perform the above method.

In still another aspect, there is a system, comprising: a graph generation unit configured to generate a coloring/grouping graph from layout data of a layout design, the layout design corresponding to at least a portion of an integrated circuit, and the coloring/grouping graph comprising nodes, coloring edges, and grouping/coloring edges, wherein the nodes represent layout features in the layout design, each of the coloring edges connects two of the nodes representing layout features that must be assigned to different masks, and each of the grouping/coloring edges connects two of the nodes representing layout features that should either be grouped together for DSA (directed-self-assembly) lithography or be assigned to different masks; a coloring unit configured to color the nodes by assigning different colors to the nodes connected directly with the coloring edges, each of the colors representing one of masks employed for multiple patterning lithography, the nodes connected with the coloring edges forming node groups, any two of the node groups being either connected with the grouping/coloring edges or not connected; and an edge adjustment unit configured to convert one or more of the grouping/coloring edges into the coloring edges, wherein the converting comprises adjusting colors of the nodes in one or more of the node groups connected by the grouping/coloring edges.

According to some embodiments of the disclosed technology, the system may further comprise a guiding pattern generation unit configured to group layout features corresponding to the nodes connected by the existing grouping/coloring edges into layout feature groups and to generate guiding patterns for the layout feature groups.

According to some other embodiments of the disclosed technology, the system may further comprise a design correction unit configured to modify the layout design to remove any coloring violations.

In still another aspect, there is a method comprising: generating a layout feature data structure from layout data of a layout design, the layout design corresponding to at least a portion of an integrated circuit, wherein the layout feature data structure comprises relationship information of layout features, the relationship information comprises coloring constraints and grouping/coloring constraints, the coloring constraint for two layout features meaning that the two layout features must be assigned to different masks, and the grouping/coloring constraint for two layout features meaning that the two layout features should either be grouped together for DSA (directed-self-assembly) lithography or be assigned to different masks; assigning different masks to the layout features with the coloring constraints, the layout features with the coloring constraints forming layout feature groups, layout features in any two of the layout feature groups having either the grouping/coloring constraints or no constraints; and converting one or more of the grouping/coloring constraints into the coloring constraints, wherein the converting comprises adjusting masks assigned to the layout features in one or more of the layout feature groups with the grouping/coloring constraints.

In still another aspect, there are one or more computer-readable media storing computer-executable instructions for causing one or more processors to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Various aspects of the present disclosed technology relate to techniques of combining directed self-assembly lithography and multiple patterning lithography. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "generate," "color" and "convert" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked, and includes both direct connections or direct links and indirect connections or indirect links through one or more intermediate elements not affecting the intended operation of the circuit.

Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

Figure 1:
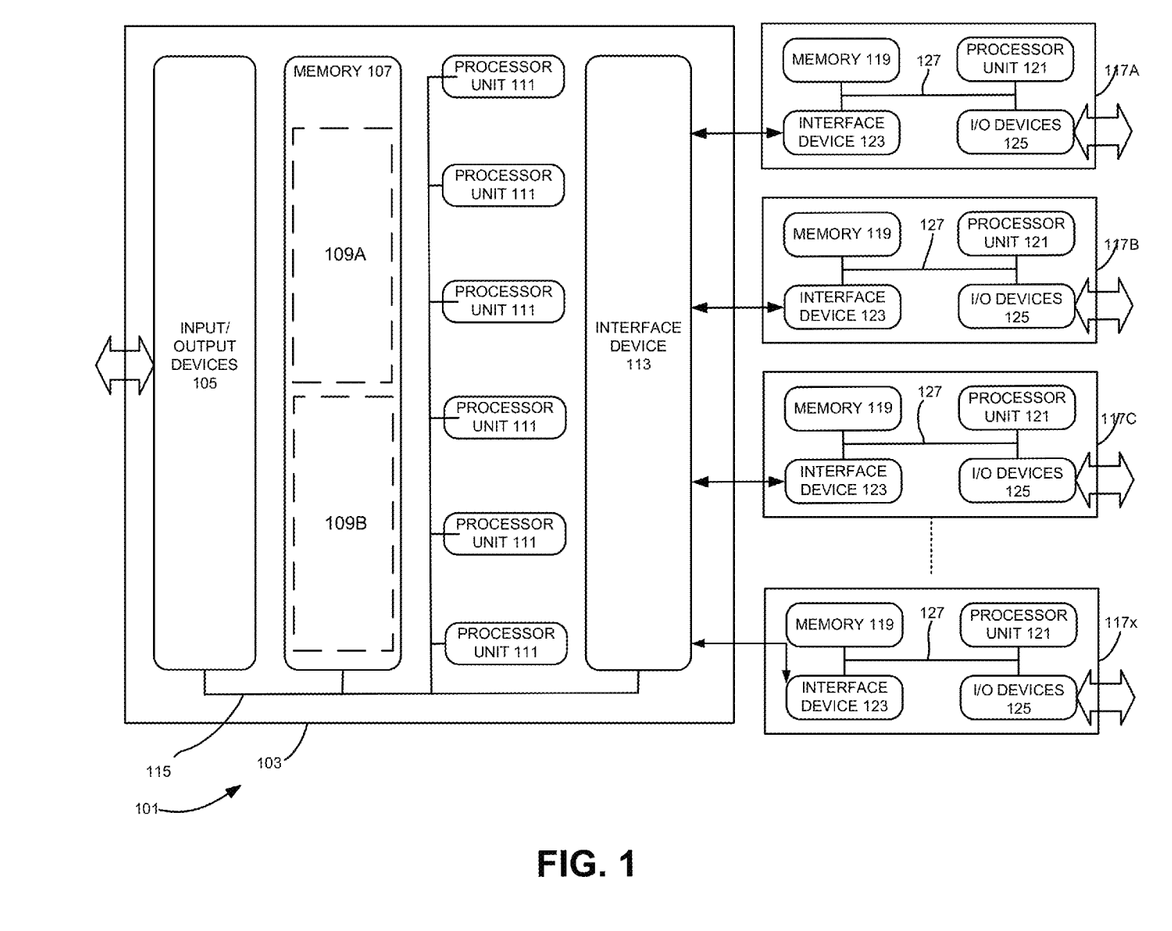
FIG. 1 illustrates an example of a computing system that may be used to implement various embodiments of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
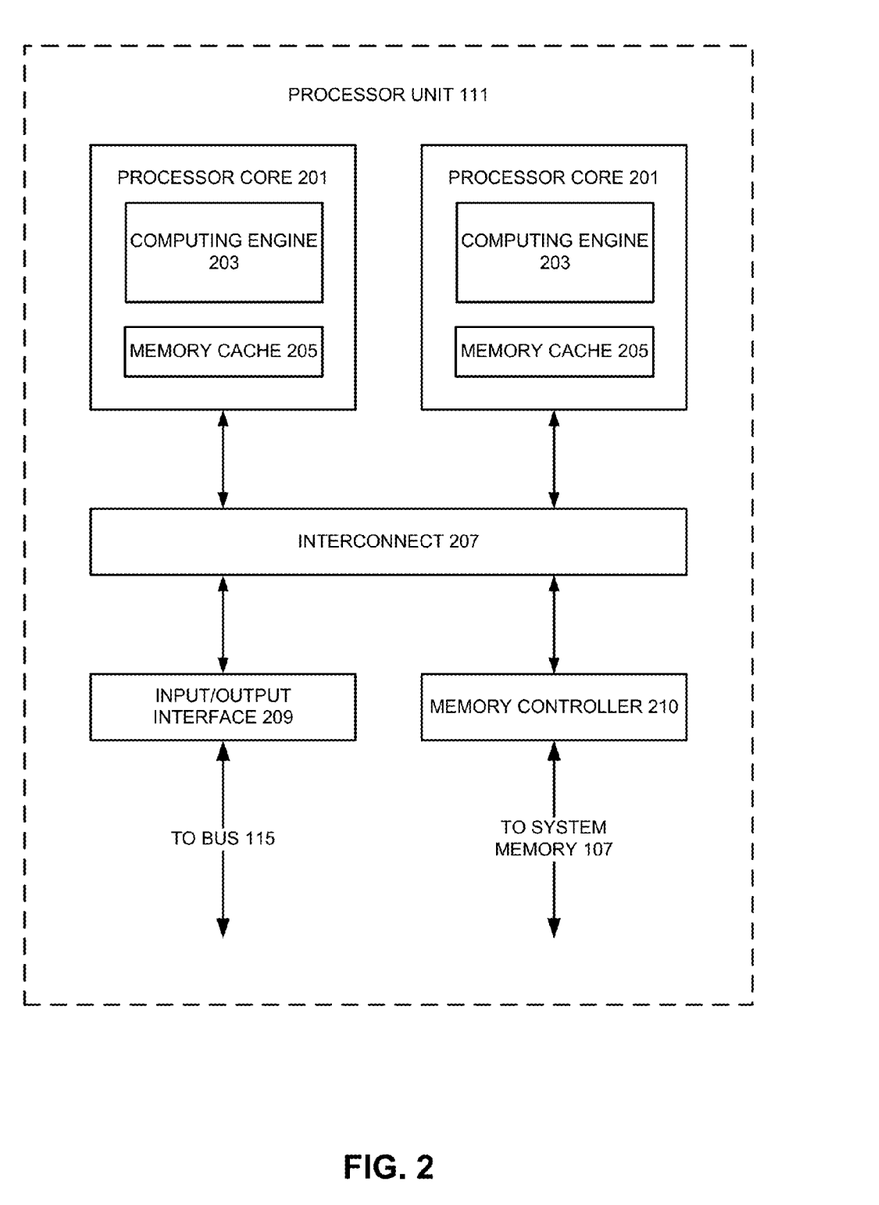
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

DSA Feature Grouping and Guiding Pattern Generation

As noted briefly in the Background section, self-assembly (DSA) may be directed or guided in two ways: graphoepitaxy and chemo-epitaxy. In a grapho-epitaxy process, topographical features such as photoresist or hard mask are used to guide the phase segregation. In a chemo-epitaxy process, a thin underlying pining layer is used to pin the phase segregation process. All process steps can be run inside a standard lithography track and etch tool. Directed self-assembly patterning processes may also be divided into two categories based on shapes of targeted lithographic patterns: one for line-type features and the other for via-type features. The line-type features may be patterned with chemo-epitaxy or grapho-epitaxy while the vis-type features are usually patterned with grapho-epitaxy.

Patterns for directing or guiding self-assembly of certain materials e.g., block copolymers are called guiding patterns. Patterns formed on a chip after a directed self-assembly process based on guiding patterns should resemble patterns desired to be "printed" (i.e., target patterns). In a graphoepitaxy process employing the PS-PMMA system, for example, self-assembled PMMA patterns correspond to target patterns.

As with other processes, directed self-assembly may generate patterns with defects. A DSA-specific defect is defined by the occurrence of an undesired morphology of the phase separation or the loss of ordering of the structure. The formation of DSA-specific defects is mainly about free energy minimization and governed by thermodynamic principles. Accordingly, generating appropriate guiding patterns is important for reducing/eliminating DSA-specific defects. For some target patterns, however, it may be too difficult if not impossible to generate appropriate guiding patterns. These target patterns are referred to as non-DSA-compliant features. Identifying and removing non-DSA-compliant features (or DSA-compliant features) can help the guiding pattern generation.

Figure 3:
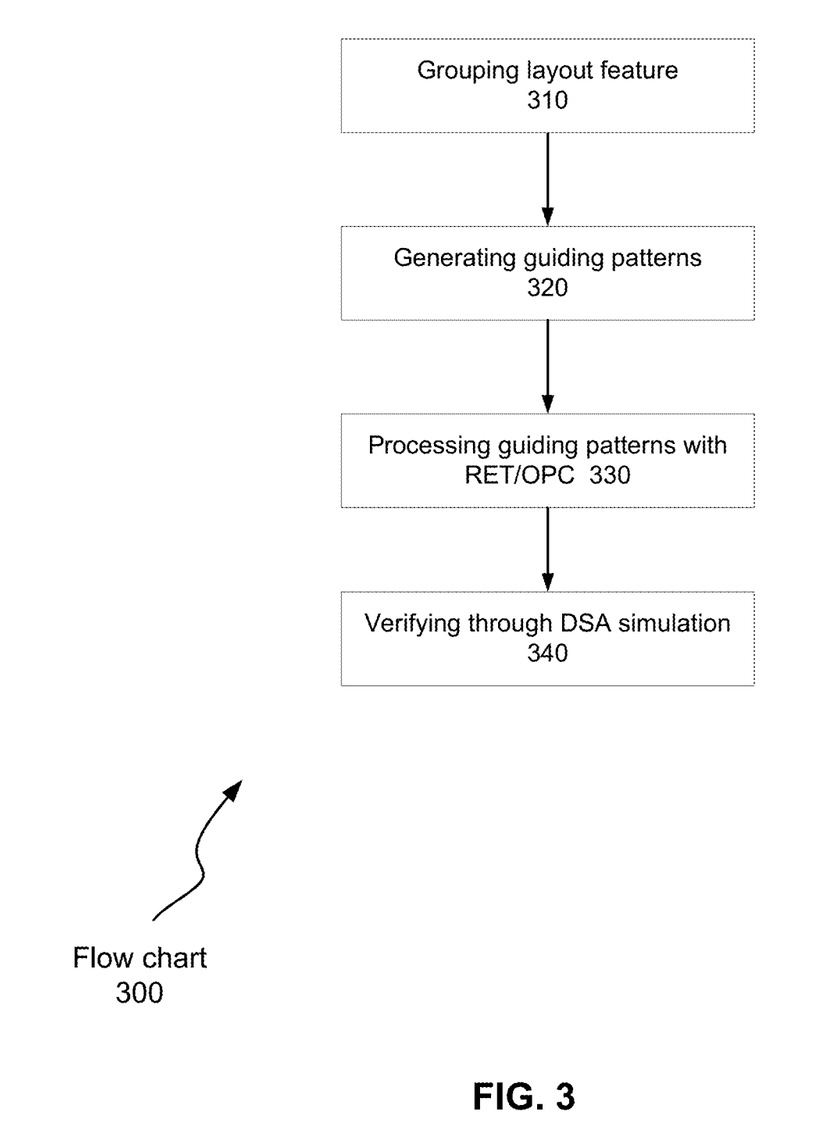
FIG. 3 illustrates an example of a flow chart describing a method for DSA guiding pattern synthesis.

FIG. 3 illustrates an example of DSA guiding pattern synthesis. In operation 310 of the flow 300, layout features are grouped based on DSA constraints. One DSA constraint is the distance between features. There is a minimum grouping distance for two vias or contacts to be grouped together. This distance may be derived from the natural pitch of the block copolymer. Two vias cannot be grouped together if they are too far apart. The maximum grouping distance is associated with the properties of the block copolymer. Another constraint that may be considered is the number of features to be grouped together. This is because the smaller size of the guiding pattern, the fewer defects. If the 193 nm lithography is employed, groups formed by non-collinear or non-Manhattan features may need to be avoided because guiding patterns are difficult to fabricate using the 193 nm lithography.

In operation 320, guiding patterns are generated (or synthesized) for the DSA groups. The generation process attempts to reverse-engineer the self-assembly process by starting from target patterns. Various techniques of generating guiding patterns for via-type feature groups have been discussed in U.S. application Ser. No. 14/083,050 and Ser. No. 14/693,304, which applications are incorporated entirely herein by reference.

In operation 330, the generated guiding patterns undergo optical proximity correction and maybe other resolution enhancement treatments such as sub-resolution assist feature (SRAF) insertion. Finally, in operation 340, verification is performed by comparing simulated patterns computed based on the processed guiding patterns with the target patterns.

The flow 300 may identify some non-DSA-compliant features, which cannot be properly grouped or be independent singletons. These non-compliant DSA features may be considered design rule violations and returned to designers for redesign. Alternatively or additionally, the multiple-patterning technique may be employed to reduce the number of non-DSA-compliant features by assigning non-DSA-compliant features to different masks. As discussed in the Background section, the combination of DSA lithography and multiple-patterning lithography can also benefit the latter by reducing the number of masks required.

DSA-MP Hybrid Lithography Tool and Methods

Figure 4:
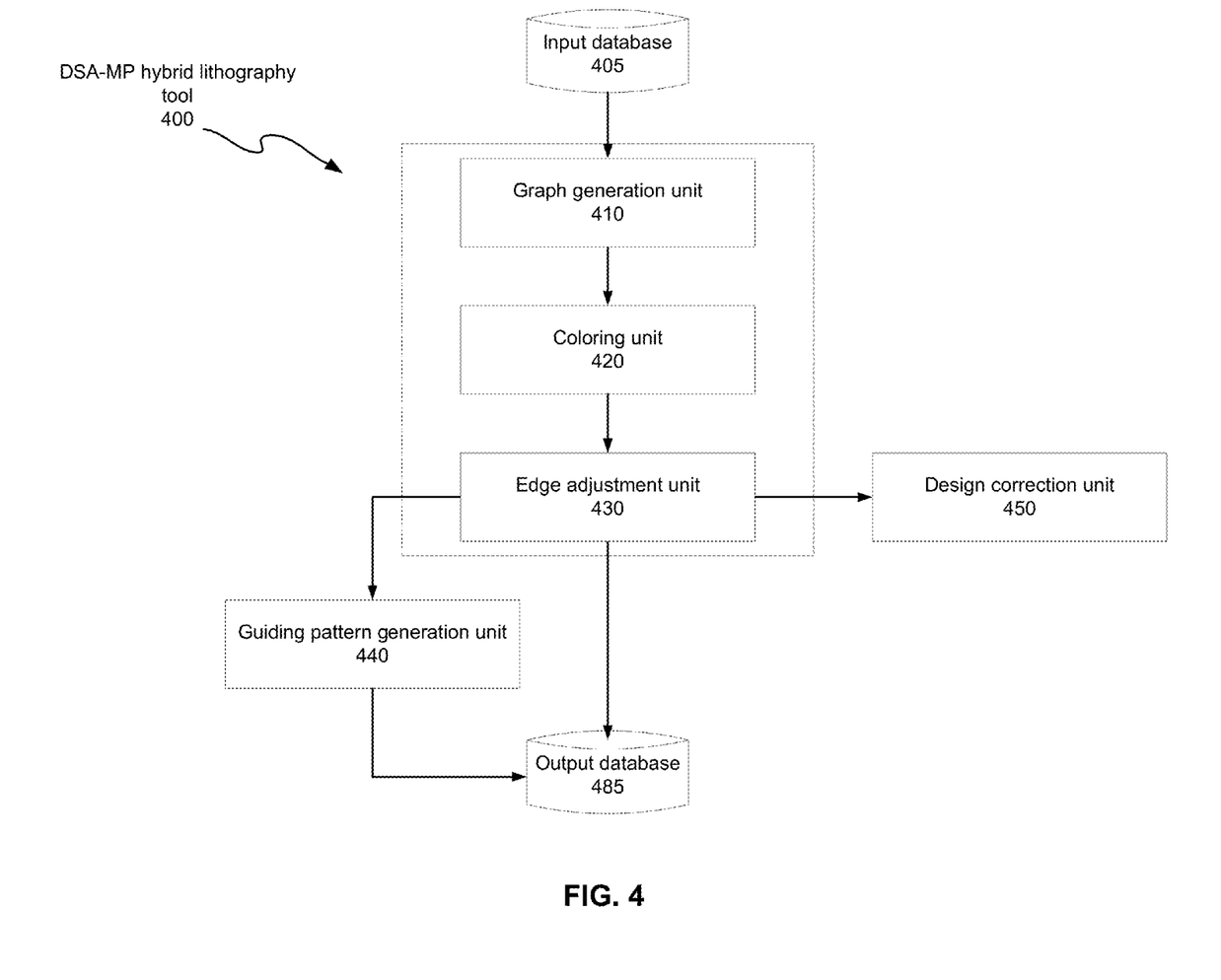
FIG. 4 illustrates an example of a DSA-MP hybrid lithography tool that may be implemented according to various embodiments of the disclosed technology.

FIG. 4 illustrates an example of a DSA-MP hybrid lithography tool 400 that may be implemented according to various embodiments of the disclosed technology. As seen in this figure, the DSA-MP hybrid lithography tool 400 includes a graph generation unit 410, a coloring unit 420 and an edge adjustment unit 430. As will be discussed in more detail below, the graph generation unit 410 generates a coloring/grouping graph from layout data of a layout design, the coloring unit 420 colors the nodes based on the coloring edges but not based on the grouping/coloring edges, and the edge adjustment unit 430 converts one or more of the grouping/coloring edges into the coloring edges by adjusting colors of the nodes in one or more of node groups connected by the grouping/coloring edges.

As will also be discussed in more detail below, some implementations of the DSA-MP hybrid lithography tool 400 may cooperate with (or incorporate) one or more of a guiding pattern generation unit 440, a design correction unit 450, an input database 405 and an output database 485. While the input database 405 and the output database 485 are shown as separate units in FIG. 4, a single data storage medium may be used to implement some or both of these databases.

According to some embodiments of the disclosed technology, one or more of the graph generation unit 410, the coloring unit 420, the edge adjustment unit 430, the guiding pattern generation unit 440, and the design correction unit 450 are implemented by one or more computing systems, such as the computing system illustrated in FIGS. 1 and 2, executing programmable instructions. Correspondingly, some other embodiments of the disclosed technology may be implemented by software-executable instructions, stored on a non-transitory computer-readable medium, for instructing a computing system to perform functions of one or more of the graph generation unit 410, the coloring unit 420, the edge adjustment unit 430, the guiding pattern generation unit 440, and the design correction unit 450. As used herein, the term "non-transitory computer-readable medium" refers to computer-readable medium that are capable of storing data for future retrieval, and not for propagating electromagnetic waves. The non-transitory computer-readable medium may be, for example, a magnetic storage device, an optical storage device, a "punched" surface type device, or a solid state storage device.

Figure 5:
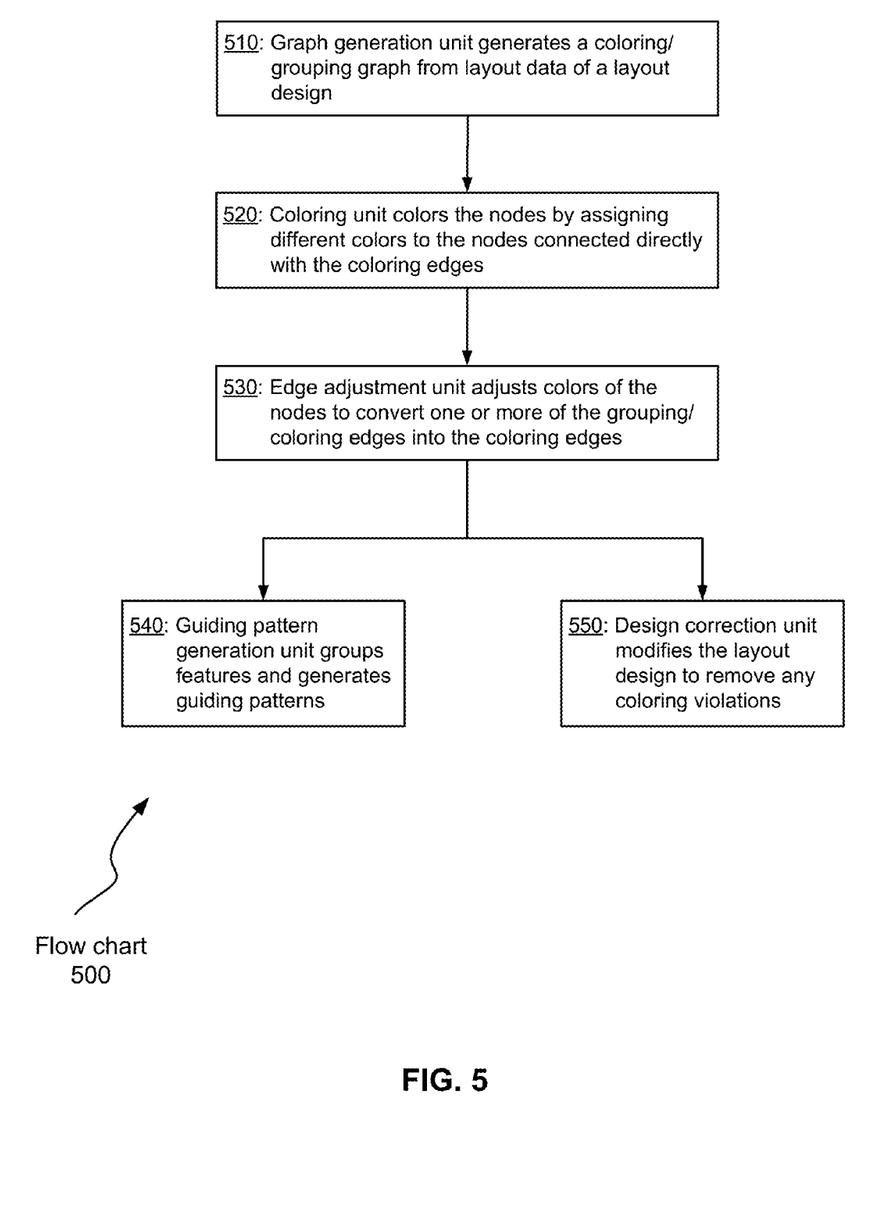
FIG. 5 illustrates an example of a flow chart describing a method of DSA-aware layout decomposition for multiple patterning that may be employed according to various embodiments of the disclosed technology.

For ease of understanding, methods of DSA-aware layout decomposition for multiple patterning that may be employed according to various embodiments of the disclosed technology will be described with reference to the DSA-MP hybrid lithography tool 400 in FIG. 4 and the flow chart 500 illustrated in FIG. 5. It should be appreciated, however, that alternate implementations of a DSA-MP hybrid lithography tool 400 may be used to perform the methods of DSA-aware layout decomposition for multiple patterning illustrated by the flow chart 500 according to various embodiments of the disclosed technology. Likewise, the DSA-MP hybrid lithography tool 400 may be employed to perform other methods of DSA-aware layout decomposition for multiple patterning according to various embodiments of the disclosed technology.

Initially, in operation 510 of the flowchart 500, the graph generation unit 410 generates a coloring/grouping graph from layout data of a layout design. A layout design is a physical design that describes specific geometric elements (layout features). The geometric elements, which typically are polygons, define the shapes that will be created in various layers of material to manufacture the circuit. The layout design may encompass data describing an entire integrated circuit device, a smaller group of data describing one or more components of an entire device such as a portion of an integrated circuit device, or data describing more than one device, such as data to be used to form multiple devices on a single wafer.

The coloring/grouping graph comprises nodes, coloring edges, and grouping/coloring edges. The nodes represent layout features in the layout design. The coloring edges and the grouping/coloring edges represent different relationships between the layout features. When two layout features are separated by a distance less than a minimum distance for lithography on a single mask, multiple-patterning lithography or DSA lithography needs to be employed. A coloring edge connects two of the nodes representing layout features that must be assigned to different masks for multiple-patterning lithography. These two layout features cannot be grouped together for the DSA lithography due to one or more violations of DSA constraints. A grouping/coloring edge, on the other hand, connects two of the nodes representing layout features that should either be grouped together for DSA lithography or be assigned to different masks for multiple-patterning lithography.

Figure 6A:
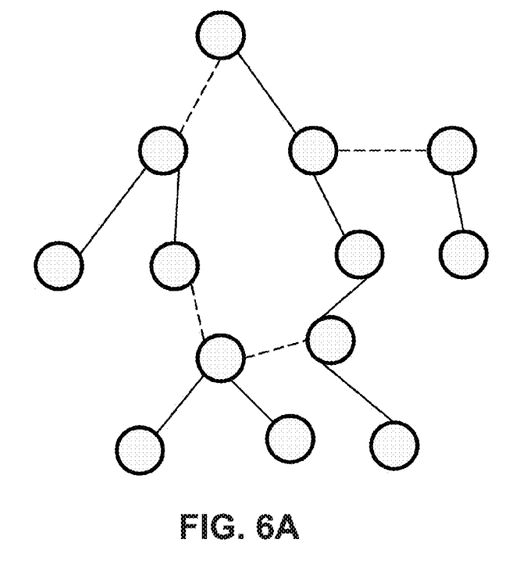
FIG. 6A illustrates an example of a coloring/grouping graph.

FIG. 6A illustrates an example of a coloring/grouping graph. In the figure, the nodes are represented by small solid circles, the coloring edges are represented by solid lines, and the grouping/coloring edges are represented by dashed lines. The example is for illustration only.

It should be appreciated that the coloring/grouping graph generated by the graph generation unit 410 represents a data structure showing a relationship of layout features in the layout design. The relationship comprises two types of constraints: layout features must be assigned to different masks for multiple patterning lithography, and layout features should either be grouped together for DSA (directed-self-assembly) lithography or be assigned to different masks.

Next, in operation 520, the coloring unit 420 colors the nodes by assigning different colors to the nodes connected directly with the coloring edges. Here, each of the colors represents one of masks employed for multiple patterning lithography. Thus, the coloring is equivalent to mask assignment.

The nodes connected with the coloring edges form node groups. Any two of the node groups are either connected with a grouping/coloring edge or not connected with any edges. The coloring unit 420 may color each of the node groups separately.

Figure 6B:
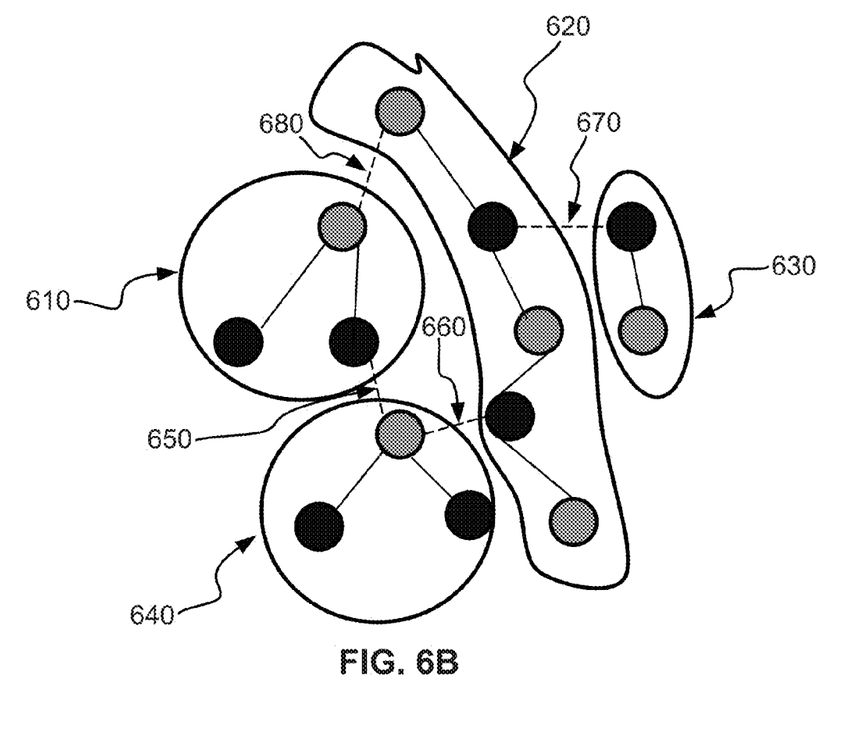
FIG. 6B illustrates an example of a coloring result of the coloring/grouping graph shown in FIG. 6A.

FIG. 6B illustrates an example of a coloring result of the coloring/grouping graph shown in FIG. 6A. In this figure, four node groups 610-640 are formed. The groups 610 and 620 are connected by a grouping/coloring edge 680; the groups 620 and 630 are connected by a grouping/coloring edge 670; the groups 620 and 640 are connected by a grouping/coloring edge 660; and the groups 640 and 610 are connected by a grouping/coloring edge 650. There is no grouping/coloring edge directly connecting the node groups 610 and 630 or the node groups 630 and 640.

Double patterning lithography is used in this example and thus the nodes are assigned with two colors. As can be seen, all of the nodes directly connected with the coloring edges are assigned to different colors. The nodes directly connected with the grouping/coloring edges, however, may be assigned to the same colors or different colors because the coloring does not consider the grouping/coloring edges. No color violation exists in any of the node groups in this example.

Next, in operation 530, the edge adjustment unit 430 converts one or more of the grouping/coloring edges into the coloring edges. If a grouping/coloring edge connects two nodes that have been assigned to two different colors, this grouping/coloring edge can be converted automatically. The conversion can also be accomplished by adjusting colors of the nodes in one or more of node groups connected by the grouping/coloring edges. The color adjustment does not change the relationship of the nodes connected directly with the coloring edges, but may cause some or all of the nodes directly connected with the grouping/coloring edges to have different colors. After the color adjustment, the grouping/coloring edges directly connecting two nodes with different colors can be converted to the coloring edges. The operation 530 may reduce the number of nodes that need to be grouped together and thus the likelihood of DSA-compliance violations. As noted previously, a DSA-compliance violation occurs if two layout features cannot be grouped together.

Figure 6C:
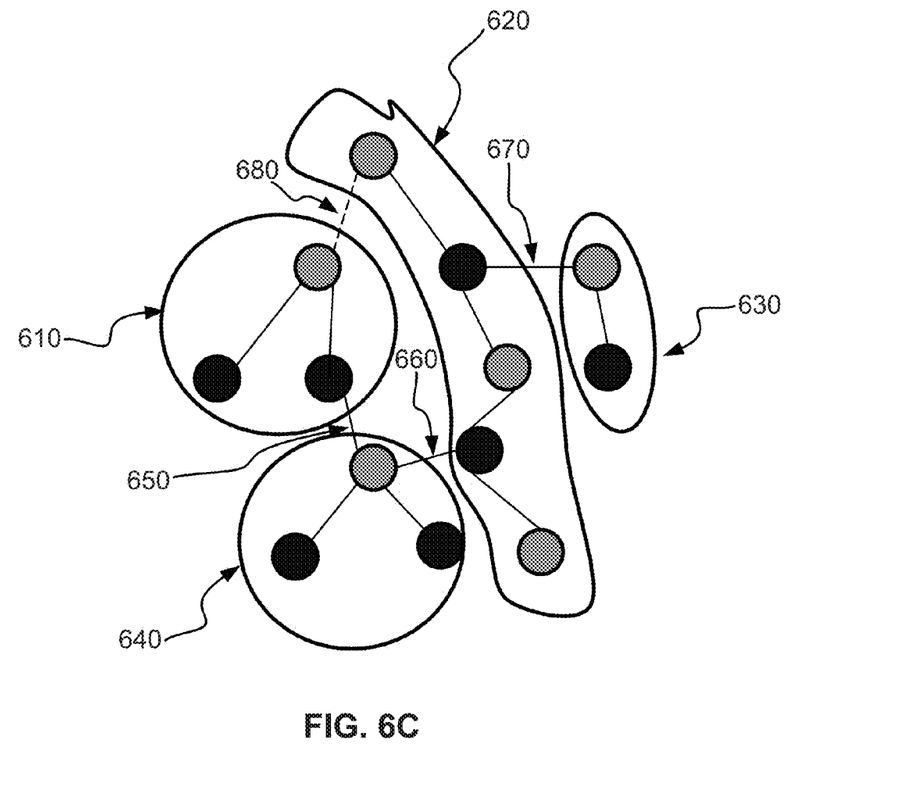
FIG. 6C illustrates an example of a color adjustment result of the coloring/grouping graph shown in FIG. 6B.

FIG. 6C illustrates an example of a color adjustment result of the coloring/grouping graph shown in FIG. 6B. In this figure, the grouping/coloring edges 650 and 660 are converted to the coloring edges automatically because they connect nodes assigned to different colors. The colors of the nodes in the note group 630 are adjusted. As a result, the grouping/coloring edge 670 is converted to a coloring edge. The grouping/coloring edge 680 cannot be converted now.

If the colors of the nodes in the note group 610 are adjusted, the grouping/coloring edge 680 can be converted to a coloring edge. Then, the edge 650 must remain as a grouping/coloring edge. One criterion for selecting which group to have the color adjustment may be used is the adjustment should maximize the number of grouping/coloring edges to be converted.

The operation 520 may identify coloring violations. For example, no coloring solution can be found for a node group. These coloring violations may be reported. With some implementations of the disclosed technology, in operation 550, the design correction unit 450 modifies layout design to remove the coloring violations. Another method to remove the coloring violations is to increase the number of masks. For example, triple patterning lithography may be used if two colors lead to coloring violations.

In operation 540, the guiding pattern generation unit 440 first groups layout features corresponding to the nodes connected by the grouping/coloring edges after the converting into layout feature groups and then generating guiding patterns for the layout feature groups. The guiding pattern generation unit 440 may use the method illustrated by the flow chart 300. During the grouping, DSA-compliance violations may be identified. Similar to the coloring violations, the layout design may be modified or the number of masks may be increased to remove the DSA-compliance violations.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions configured to, when executed, cause one or more computing devices to:
generate a nodal graph for at least a portion of a layout for an integrated circuit design, wherein the nodal graph comprises a plurality of nodes that represent features in the portion of the layout for the integrated circuit design, wherein each of the plurality of nodes is directly connected to another node by a first type of edge or a second type of edge, wherein the first type of edge is used to connect a first set of two nodes from the plurality of nodes if the first set of two nodes represents features that must be assigned to different masks, and wherein the second type of edge is used to connect a second set of two nodes from the plurality of nodes if the second set of two nodes represents features that are to be grouped together for directed self-assembly (DSA) lithography or be assigned to different masks;
identify a plurality of node groups based on the nodal graph, wherein each of the plurality of node groups comprises two or more nodes that are connected to each other via one or more first edges of the first type of edge, and wherein each of the plurality of node groups is connected to one or more other groups from the plurality of node groups based on one or more second edges of the second type of edge;
assign, based on the plurality of node groups, each node in the nodal graph to one of a plurality of masks used for multiple patterning lithography such that directly-connected nodes within a node group are assigned to different masks from each other;
convert, after assigning each node in the nodal graph to one of the plurality of masks, at least one of the one or more second edges into the first type of edge; and
generate, after converting the at least one of the one or more second edges into the first type of edge, one or more guiding patterns based on the nodal graph.

2. The one or more non-transitory computer-readable media recited in claim 1, wherein causing the one or more computing devices to assign each node in the nodal graph to one of the plurality of masks comprises causing the one or more computing devices to color each node, and wherein the computer-executable instructions are configured to, when executed, cause the one or more computing devices to:
report coloring violations.

3. The one or more non-transitory computer-readable media recited in claim 2, wherein the computer-executable instructions are configured to, when executed, cause the one or more computing devices to:
modify the layout to remove the coloring violations.

4. The one or more non-transitory computer-readable media recited in claim 1, wherein the nodal graph comprises an unconverted second type of edge after converting the at least one of the one or more second edges into the first type of edge, and wherein the computer-executable instructions are configured to, when executed, cause the one or more computing devices to:
group features represented by two nodes that are directly connected to each other by the unconverted second type of edge into a feature group; and
wherein causing the one or more computing devices to generate the one or more guiding patterns based on the nodal graph comprises causing the one or more computing devices to generate a guiding pattern for the feature group.

5. The one or more non-transitory computer-readable media recited in claim 1, wherein two nodes that are directly connected to each other by an edge from the one or more second edges represent features that comprise one or more vias.

6. The one or more non-transitory computer-readable media recited in claim 1, wherein causing the one or more computing devices to assign each node in the nodal graph to one of the plurality of masks results in a first node within a first node group from the plurality of node groups being assigned to a first mask, and wherein the computer-executable instructions are configured to, when executed, cause the one or more computing devices to:
determine that adjusting a mask assignment associated with the first node group would maximize a number of the one or more second edges that are convertible; and
adjust mask assignment such that the first node is assigned to a second mask different from the first mask.

7. A method, comprising:
generating a nodal graph for at least a portion of a layout for an integrated circuit design, wherein the nodal graph comprises a plurality of nodes that represent features in the portion of the layout for the integrated circuit design, wherein each of the plurality of nodes is directly connected to another node by a first type of edge or a second type of edge, wherein the first type of edge is used to connect a first set of two nodes from the plurality of nodes if the first set of two nodes represents features that must be assigned to different masks, and wherein the second type of edge is used to connect a second set of two nodes from the plurality of nodes if the second set of two nodes represents features that are to be grouped together for directed self-assembly (DSA) lithography or be assigned to different masks;
identifying a plurality of node groups based on the nodal graph, wherein each of the plurality of node groups comprises two or more nodes that are connected to each other via one or more first edges of the first type of edge, and wherein each of the plurality of node groups is connected to one or more other groups from the plurality of node groups based on one or more second edges of the second type of edge;
assigning, based on the plurality of node groups, each node in the nodal graph to one of a plurality of masks used for multiple patterning lithography such that directly-connected nodes within a node group are assigned to different masks from each other;
converting, after the assigning, at least one of the one or more second edges into the first type of edge; and
generating, after the converting, one or more guiding patterns based on the nodal graph.

8. The method recited in claim 7, wherein the assigning comprises coloring each node, and wherein the method further comprises:
reporting coloring violations.

9. The method recited in claim 8, further comprising:
modifying the layout to remove the coloring violations.

10. The method recited in claim 7, wherein the nodal graph comprises an unconverted second type of edge after the converting, and wherein the method further comprises:
grouping features represented by two nodes that are directly connected to each other by the unconverted second type of edge into a feature group; and
wherein the generating the one or more guiding patterns based on the nodal graph comprises generating a guiding pattern for the feature group.

11. The method recited in claim 7, wherein two nodes that are directly connected to each other by an edge from the one or more second edges represent features that comprise one or more vias.

12. The method recited in claim 7, wherein the assigning results in a first node within a first node group from the plurality of node groups being assigned to a first mask, and wherein the method further comprises:
determining that adjusting a mask assignment associated with the first node group would maximize a number of the one or more second edges that are convertible; and
adjusting the mask assignment such that the first node is assigned to a second mask different from the first mask.

13. The method of claim 7, wherein the converting the at least one of the one or more second edges into the first type of edge comprises converting the at least one of the one or more second edges based on nodes that are directly connected by the at least one of the one or more second edges being assigned to different masks from each other.

14. One or more computing devices comprising:
one or more processors; and
memory storing computer-executable instructions that, when executed by the one or more processors, cause the one or more computing devices to:
generate a nodal graph for at least a portion of a layout for an integrated circuit design, wherein the nodal graph comprises a plurality of nodes that represent features in the portion of the layout for the integrated circuit design, wherein each of the plurality of nodes is directly connected to another node by a first type of edge or a second type of edge, wherein the first type of edge is used to connect a first set of two nodes from the plurality of nodes if the first set of two nodes represents features that must be assigned to different masks, and wherein the second type of edge is used to connect a second set of two nodes from the plurality of nodes if the second set of two nodes represents features that are to be grouped together for directed self-assembly (DSA) lithography or be assigned to different masks;
identify a plurality of node groups based on the nodal graph, wherein each of the plurality of node groups comprises two or more nodes that are connected to each other via one or more first edges of the first type of edge, and wherein each of the plurality of node groups is connected to one or more other groups from the plurality of node groups based on one or more second edges of the second type of edge;
assign, based on the plurality of node groups, each node in the nodal graph to one of a plurality of masks used for multiple patterning lithography such that directly-connected nodes within a node group are assigned to different masks from each other;
convert, after assigning each node in the nodal graph to one of the plurality of masks, at least one of the one or more second edges into the first type of edge; and
generate, after converting the at least one of the one or more second edges into the first type of edge, one or more guiding patterns based on the nodal graph.

15. The one or more computing devices recited in claim 14, wherein the nodal graph comprises an unconverted second type of edge after converting the at least one of the one or more second edges into the first type of edge, and wherein the computer-executable instructions are configured to, when executed by the one or more processors, cause the one or more computing devices to:
    group features represented by nodes that are directly connected to each other by the unconverted second type of edge into a feature group; and
    wherein causing the one or more computing devices to generate the one or more guiding patterns based on the nodal graph comprises causing the one or more computing devices to generate a guiding pattern for the feature group.

16. The one or more computing devices recited in claim 14, wherein causing the one or more computing devices to assign each node in the nodal graph to one of the plurality of masks comprises causing the one or more computing devices to color each node, and wherein the computer-executable instructions are configured to, when executed by the one or more processors, cause the one or more computing devices to:
    modify the layout to remove any coloring violations.

17. The one or more computing devices recited in claim 14, wherein two nodes that are directly connected to each other by an edge from the one or more second edges represent features that comprise one or more vias.

18. The one or more computing devices recited in claim 14, wherein causing the one or more computing devices to assign each node in the nodal graph to one of the plurality of masks results in a first node within a first node group from the plurality of node groups being assigned to a first mask, and wherein the computer-executable instructions are configured to, when executed by the one or more processors, cause the one or more computing devices to:
    determine that adjusting a mask assignment associated with the first node group would maximize a number of the one or more second edges that are convertible; and
    adjust mask assignment such that the first node is assigned to a second mask different from the first mask.

19. One or more non-transitory computer-readable media storing computer-executable instructions configured to, when executed, cause one or more computing devices to:
    generate a layout feature data structure for at least a portion of a layout for an integrated circuit design, wherein the layout feature data structure comprises relationship information associated with different sets of two features from the portion of the layout for the integrated circuit design, wherein the relationship information comprises first constraints and second constraints, wherein each of the first constraints indicates that two features must be assigned to different masks, and wherein each of the second constraints indicates that two features are to be grouped together for directed self-assembly (DSA) lithography or be assigned to different masks;
    identify a plurality of groups based on the layout feature data structure, wherein each of the plurality of groups comprises two or more features that are associated via one or more of the first constraints, and wherein each of the plurality of groups is associated to one or more other groups from the plurality of groups based on one or more of the second constraints;
    assign, based on the plurality of groups, each feature to one of a plurality of masks used for multiple patterning lithography such that directly-associated features within a group are assigned to different masks from each other;
    convert, after assigning each feature to one of the plurality of masks, at least one of the second constraints into at least one of the first constraints; and
    generate, after converting the at least one of the second constraints into at least one of the first constraints, one or more guiding patterns based on the layout feature data structure.

20. A method, comprising:
    generating a layout feature data structure for at least a portion of a layout for an integrated circuit design, wherein the layout feature data structure comprises relationship information associated with different sets of two features from the portion of the layout for the integrated circuit design, wherein the relationship information comprises first constraints and second constraints, wherein each of the first constraints indicates that two features must be assigned to different masks, and wherein each of the second constraints indicates that two features are to be grouped together for directed self-assembly (DSA) lithography or be assigned to different masks;
    identifying a plurality of groups based on the layout feature data structure, wherein each of the plurality of groups comprises two or more features that are associated via one or more of the first constraints, and wherein each of the plurality of groups is associated to one or more other groups from the plurality of groups based on one or more of the second constraints;
    assigning, based on the plurality of groups, each feature to one of a plurality of masks used for multiple patterning lithography such that directly-associated features within a group are assigned to different masks from each other;
    converting, after assigning each feature to one of the plurality of masks, at least one of the second constraints into at least one of the first constraints; and
    generating, after converting the at least one of the second constraints into at least one of the first constraints, one or more guiding patterns based on the layout feature data structure.

* * * * *